United States Patent [19]

Sasago et al.

[11] Patent Number: 4,745,042
[45] Date of Patent: May 17, 1988

[54] WATER-SOLUBLE PHOTOPOLYMER AND METHOD OF FORMING PATTERN BY USE OF THE SAME

[75] Inventors: Masaru Sasago, Hirakata; Masayuki Endo, Izumi; Kenichi Takeyama, Osaka; Noboru Nomura, Toyonaka, all of Japan

[73] Assignee: Matsushita Electric Industrial Co., Ltd., Osaka, Japan

[21] Appl. No.: 724,304

[22] Filed: Apr. 17, 1985

[30] Foreign Application Priority Data

Apr. 19, 1984 [JP] Japan .................... 59-78868
Oct. 4, 1984 [JP] Japan .................. 59-208501
Oct. 4, 1984 [JP] Japan .................. 59-208502

[51] Int. Cl.$^4$ .............. G03C 1/495; G03C 1/52; G03C 1/71; G03C 5/16
[52] U.S. Cl. .................... 430/156; 430/270; 430/280; 430/271; 430/272; 430/273; 430/311; 430/312; 430/339; 430/396; 430/494; 430/512; 430/514; 430/507; 430/515; 430/516; 522/88; 522/89
[58] Field of Search ............. 204/159.12; 430/280, 430/270, 271, 272, 273, 311, 339, 396, 494, 512, 514, 507, 515, 516, 312, 156

[56] References Cited

U.S. PATENT DOCUMENTS

| | | | |
|---|---|---|---|
| 3,511,653 | 5/1970 | Wiebe .................... | 430/396 |
| 3,515,551 | 6/1970 | Audran et al. .......... | 430/270 |
| 3,595,657 | 7/1971 | Robinson et al. ....... | 430/339 X |
| 3,960,685 | 6/1976 | Sano et al. ............. | 430/325 X |
| 3,965,278 | 6/1976 | Duinker et al. ........ | 427/54 |
| 4,025,191 | 5/1977 | Seward, III ............ | 355/71 |
| 4,029,616 | 6/1977 | Nakashio et al. ....... | 204/159.12 X |

FOREIGN PATENT DOCUMENTS 0110165 6/1984 European Pat. Off. .
228029 9/1982 German Democratic Rep. .

OTHER PUBLICATIONS

H. J. Zweig, "Nonlinear Filter", *IBM Technical Disclosure Bulletin*, vol. 8, No. 7, Dec. 1965, p. 980.

Primary Examiner—Paul R. Michl
Assistant Examiner—Cynthia Hamilton
Attorney, Agent, or Firm—Wenderoth, Lind & Ponack

[57] ABSTRACT

This invention relates to a composition of a water-soluble photopolymer which is synthesized from a water-soluble organic matter, which matter is a base polymer produced and refined particularly by bacterial culture biotechnically and contains at least one of polysaccharides, protein, gelatin, casein, polyvinyl pyrrolidone and polyvinyl alcohol, in particular pullulan which is a natural polysaccharide, and chemicals to add functions to aqueous solution of the base polymer, for example, water-soluble radiation sensitive chemical, crosslinking agent, catalyst, epoxy compound, and a compound possessing bleaching or fading action with respect to radiation.

The water-soluble photopolymer can be developed in water, and is high in safety and small in aging, and is expected to be used as the material of single-layer resist or multi-layer resist of high resolution and high resistance, or as the material for contrast enhanced litography. Besides, when it is applied in said pattern forming method, much finer patterns may be formed.

12 Claims, 14 Drawing Sheets

Distance (S) between Step position and Resist (μm)

EXPOSED TIME (msec)

WATER-SOLUBLE PHOTOPOLYMER AND METHOD OF FORMING PATTERN BY USE OF THE SAME

BACKGROUND OF THE INVENTION

This invention relates to a water-soluble photopolymer and method of forming a pattern by using the same, and more particularly to water-soluble photopolymer by use of which the resolution of photolithography is greatly improved to the level of a submicron order, and the method of forming a pattern wherein high resolution of the pattern is accomplished.

The enhancement of the degree of a integration of semiconductor integrated circuit leading up to the level of VLSI owes much to the improvement of resolution of the photolithography by the use of light. This improvement of resolution has been promoted to the limit of the light by the technical development of hard ware, i.e., light exposure apparatus and by technical development of software, i.e., pattern forming method (for instance, the development of multilayer resist technology). At present, lines in the order of microns can be drawn by the use of photolithography, and a 1M-bit DRAM is realized in the MOS memory field. Furthermore, an advanced photolithographic technology for drawing lines of a submicron order has been energetically researched and developed recently, and a hardware approach, such as the improvement of performance of an optical system using a reduced projection exposure method, has been reported. On the other hand, the enhancement of performance of the resolution from the aspect of using a process of pattern forming technology has been also proposed recently. In either case, however, the question "where is the limit of light?" is not clearly answered yet. Incidentally, lithography using radiation other than light, such as X-rays, and electron beam wafer direct writing, is being studied, but considering its technical barrier and existing production facilities, it seems the shortest way to achieve the VLSI to improve the existing lithography using light, is in the direction of extending the "life of light," rather than seeking the technology of a non-light lithography.

To form a high-precision pattern of a submicron order by said photolithographic technique, the first step is to realize a high performance, high resolution resist, the second step is to realize a multilayer resist to present the effects of step differences on an LSI substrate and a reflection on a high reflectivity substrate, and a third step is to realize a film material and pattern forming method possessing the function of substantially enhancing the resolution which was conventionally limited in the known methods.

Conventionally, regarding the first point of realizing a high performance, high resolution resist, resists of nylon, unsaturated polyesters, urethane, polyvinyl alcohol (PVA), cellulose acetate, diazo-novolak and other systems have been disclosed as positive resists, and all but PVA resists are developed in an alkaline solution or an alcohol or other organic solvents. Unlike the others, the PVA resist can be developed in water, which is a great advantage in waste liquid treatment or other aspects. However, the PVA resist is too high in viscosity, and is likely to deteriorate at room temperature, and it is hard to handle. Besides, this high viscosity requires an immensely long time in the mixing with other monomers or photopolymerization starters in the resist pattern forming process. The dissolution speed of PVA in water is not necessarily high, and development in water takes a long time, and since the resin in the hardened part may slightly elute, the pattern image obtained by development tends to be unclear. If the molecular weight is lowered in order to reduce this viscosity, however, the mechanical strength of the obtained resin is significantly lowered. One may consider lowering the viscosity by diluting the aqueous solution at the time of preparation, but this is quite uneconomical because the viscosity is changed due to evaporation of water.

Relating now to the second point of preventing the effects of step difference and reflection, in a desired multilayer resist, wires are formed in steps on a substrate such as semiconductor substrate, and supposing the surface to be coated with one layer of resist, if the film thickness of the resist applied on a flat substrate is assumed to be $t_{R1}$, the resist film thickness on the stepped part is $t_{R2}$ being determined by the viscosity of the resist itself and the rotating speed at the time of coating. At this time, to set $t_{R1} = t_{R2}$, that is, to eliminate the difference of resist film thickness at the undulated part is physically impossible. Thus, in a film thickness of $t_{R1} \neq t_{R2}$, when a resist pattern is formed at right angle to the step pattern, the pattern width is determined as $l_1$ at the position of film thickness $t_{R1}$ of resist pattern, and since there is a relation of $t_{R1} > t_{R2}$ at the position of film thickness $t_{R2}$, the pattern width becomes $l_2$ ($l_1 > l_2$), and a dimensional conversion difference occurs at the stepped part. That is, in a very delicate pattern, a favorable line width control is not achieved, and the thickness of the edge part of step becomes substantially greater than the film thickness $t_{R1}$ of the flat part, the resolution declines. Generally, the resolution increases as the film thickness of resist decreases. This is because the incident energy is attenuated due to an interference and diffraction phenomenon when the gaps are finer by the wavelength of the radiation itself. That is, if only the resist is applied in a thick coat to reduce the apparent resist film thickness difference for the purpose of decreasing the resist film thickness difference on the stepped part, the resolution is lowered, which is not favorable from the viewpoint of pattern forming.

To enhance the resolution and dimensional precision on the step by the single layer resist, conventionally, a tri-layer structure, a double-layer structure, and other multi-layer resist systems have been proposed. The most popular tri-layer structure is described below. A step is formed on a substrate, and a thick coat of organic film, such as photo resist, is applied on it, and an inorganic film, for example, plasma $Si_3N_4$ film or spin-on-glass (S.O.G.), is formed on said organic film, then a thin layer of resist is applied as the top coat. By patterning this top coat of resist layer, a resist pattern is obtained. By a dry etching technique through this resist pattern, an inorganic film pattern is obtained. Finally, through the resist pattern and inorganic film pattern, an organic film pattern is formed by an oxygen system gas plasma.

In this pattern forming by a tri-layer resist, the resolution is high because the resist can be applied thinly as the top coat, and since the organic film in the bottom layer is applied thickly, the resist pattern may be obtained without the effect of step differences on the substrate surface, so that the deterioration of dimensional precision is small. However, it is technically difficult to detect the end point in a dry etching technique and the etching condition is complicated because of the multilayer structure, and the processing time is long and it is not preferable from the standpoint of mass production and economy.

To solve these problems of tri-layer resist, a double-layer resist structure is proposed. For example, in the double-layer resist structure, a positive resist, in particular, a positive ultraviolet (UV) resist is explained below. A positive UV resist is applied on a substrate such as semiconductor substrate in a greater thickness than the stepped part of wiring or the like to make the surface flat, and soft baking is applied. By irradiating the entire surface of the positive UV resist with UV light, a sensitized positive UV resist is obtained. This sensitized positive UV resist is heat-treated to such an extent that the photosensitive reaction may not be lowered, and this positive UV layer is treated with a halide solution such as $CF_4$, $CCl_2F.CClF_2$, $CCl_4$ or $SF_6$ solution by a spin-on or dip method, and a positive UV resist denatured layer is formed. Next, a second positive UV resist of the same type as a positive UV resist of first layer is applied on the denatured layer of the first positive UV resist, and baked. At this time, since the denatured layer has been formed, the second positive UV resist may be laminated in a separate form, without melting, on the first positive UV resist. Using a mask having a pattern, the first and second positive UV resists are selectively irradiated with ultraviolet rays in other parts than the chrome part which is the light shielding area. The surface is developed and removed, leaving the second positive UV resist and first positive UV resist in other parts than the ultraviolet ray exposed parts. In this series of processes, a fine pattern can be formed while applying the resist layer in a thick coat, and the dimensional precision at the stepped part is improved.

However, it is difficult to laminate resists of identical shape and identical composition, and complicated processes such as surface treatment are increasing.

Concerning the third point of limitation of the resolution due to the optical performance of a exposure device, generally, the resolution R of ultraviolet ray exposure is expressed in the following Rayleigh's law.

$$R = 0.6 \times \lambda/NA \times (1 + 1/m) \qquad (1)$$

where
$\lambda$: wavelength
AN: lens numerical aperture
m: magnification

To enhance the resolution, a shortening of the wavelength or an increase of NA may be considered, but at the present technical level of an optical system, if the wavelength is 365 nm (i-line) and NA is 0.4, the resolution R is 0.6 $\mu$m, which is estimated to be inferior to that of electron beam exposure or X-ray exposure.

In 1983, however, B. F. Griffing et al. of General Electric Co. of the United States disclosed a method of improving the resolution and pattern shape by laminating the contrast enhancement layer to promote the contrast of the optical strength profile on the resist for pattern forming (Contrast Enhanced Photolithography, B. F. Griffing et al., IEEE-ED, Vol. EDL-4, No. 1, Jan. 1983). According to their report, the resolution is possible up to 0.4 $\mu$m in the ordinary reduced projection method ($\lambda$: 436 nm, NA: 0.32).

As a result of research by the present inventors, the following requirements are found as the characteristics of the pattern forming organic film for enhancing the contrast.

First of all, relating to the problems in exposure by light, for example, in an ordinary reduced projection method, the optical strength profile of the output by reduced projection ekposure method is processed by its optical lens system. To wit, if exposed through a reticle, the ideal diffraction-free incident light intensity profile is a perfect short waveform, and its contract C is expressed in the following equation.

$$C = \frac{I_{max} - I_{min}}{I_{max} + I_{min}} \times 100(\%) \qquad (2)$$

At this time, the contrast C is 100%. Its input waveform, when passing through the optical lens, is Fourier-transformed by the transmission function of the optical lens system, and becomes closer to the shape of a cosine wave as the output waveform, and the contact C is deteriorated at the same time. This contrast deterioration greatly affects the pattern formation, for example, the resolution and pattern shape. Incidentally, the contrast required for resist pattern resolution is said to be more than 60% the characteristic of the resist itself, and when the contrast C becomes less than 60%, the pattern formation is disabled.

Using a resist film which tends to be small in the transmission of ultraviolet rays in a region of short exposure time (small exposure energy) and large in a region of large exposure energy, by passing said output waveform close to cosine waveform through this film, it has been found that the contrast C tends to increase. To explain this further quantitatively, the parameter expressed as an exposure absorption dependent term A of the positive resist in a report by F. H. Dill et al. of IBM, U.S.A. (Characterization of Positive Photoresist, F. H. Dill et al., IEEE-ED, vol. ED-22, No. 7, July 1975) is used. Generally, A is expressed as follows.

$$A = \frac{1}{d} \ln \left[ \frac{T(\infty)}{T(o)} \right] \qquad (3)$$

and it is preferable that A tends to be greater for the enhancement of contrast. For the increasing tendency of A, the smallness of d (film thickness) and the largeness of ratio of T(o) (initial transmission) to T($\infty$) (final transmission) are required.

Returning here to the GE report, below is explained the pattern forming process using the contrast enhanced lithography (CEL) disclosed by Griffing et al. of GE. In the first place, a resist is applied by rotation on the substrate. Next, a contrast enhanced layer (CEL) is applied by rotation on this resist. The surface is selectively exposed with ultraviolet rays (UV) by the reduced projection method. At the same time, part of the resist is selectively exposed, and the entire CEL is removed. Finally, an ordinary developing process is given to from a resist pattern. In this method, the required conditions of CEL are the property to enhance contrast, an ability to prevent melting of the resist for forming the lower layer of pattern, and an ability to prevent deterioration of the characteristic of the resist by the fluid to remove the CEL. Because of these requirements, the material composition is considerably limited. Besides, the CEL removing process exists as a complicated and risky step from the viewpoint of the process operation. Furthermore, on a substrate of a large scale integration circuit (LSI), a step difference is always present, and the surface is not made flat if a resist is applied on the step. When a layer to enhance the contrast, that is, CEL is applied on this uneven resist surface, a difference in film thickness occurs as a natural consequence. That is, the surface is not flat. Since parameter A in eq. (3) depends on d (film thickness), the value of A varies with the fluctuation of film thickness, and the contrast enhancing effect is altered at the same time, and the resist line width changes, which may lead to deterioration of pattern precision. This is further explained. When a resist is applied on a stepped substrate, the film thickness of the resist does not become flat in the present rotary coating method. Next, when a CEL film is applied on the resist, the thickness of the CEL film varies, and said parameter A changes. Therefore, when the CEL film is removed by developing the resist and forming the pattern, the width of resist pattern does not remain constant, and the precision of the pattern width deteriorates.

SUMMARY OF THE INVENTION

This invention is accordingly intended to present a water-soluble photopolymer capable of notably enhancing its resolution by utilizing the technology of photolithography by using light.

In this invention, at least one of water-soluble polymers, such as a polysaccharide, a protein, a polyvinyl pyrrolidone, and a polyvinyl alcohol, is used as the principal ingredient. Such water-soluble polymers may be prepared by refining from an ordinary chemical synthetic technology or by refining by producing from outside of the organisms by biochemical engineering technology. However, in this invention, the following conditions must be satisfied:

(1) They must be freely soluble in water and neutral.
(2) Insoluble in inorganic solvent.
(3) Free of thixotropy such as gelation and aging.
(4) Stable viscosity despite pH changes.
(5) High heat resistance, and high transparency from ultraviolet to infrared rays.
(6) Molecular weight freely controllable from tens of thousand to millions by varying the culture conditions.
(7) Easy to mix in other agents.
(8) Free controllability of solubility ( in water, organic solvent).

because of these conditions, a refining method by biochemical technology is advantageous to satisfy because all of these requirements.

For example, in this invention, pullulan, a natural polysaccharide refined biotechnically is used as the main polymer of a water-soluble polymer. Pullulan is also known as trigluco-polysaccharide, and it is a viscous polysaccharide produced outside the organism, that is, within the culture fluid, when Aureobasidium pullulans, which is a kind of black yeast, is incubated in proper conditions by using cane sugar or starch decomposed product as the carbon source and adding peptone and various salts to the culture medium. The structure of pullulan is as follows.

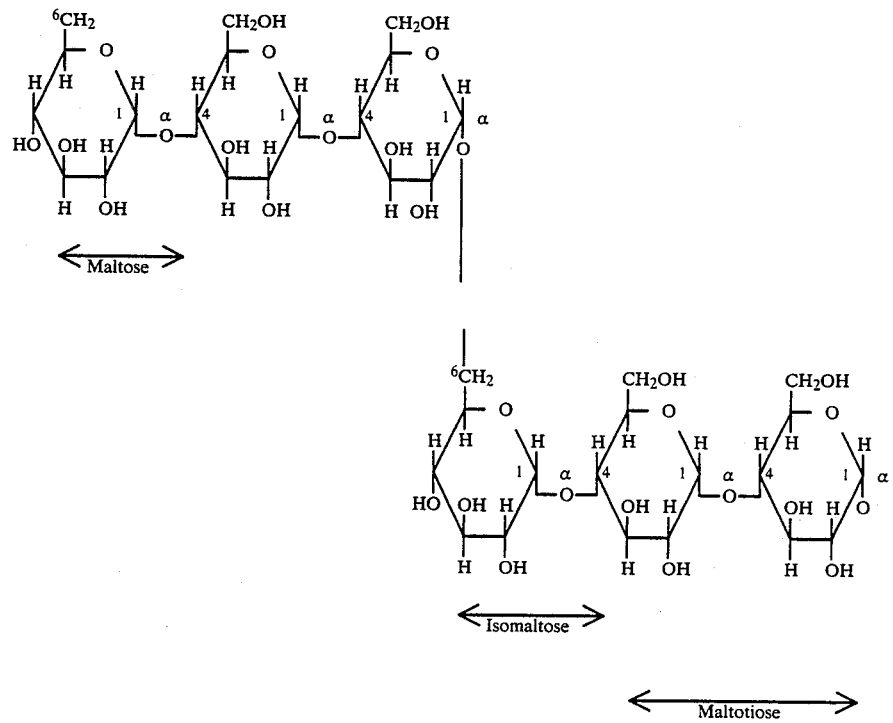

That is, the structure of pullulan is an orderly α-1, 6 bonding of maltotriose (three molecules of glucose being α-1, 4 bonded), and this substance satisfies all the above-discussed features, and it is applied widely in food processing, general industrial, cosmetics, pharmaceuticals and biochemical fields.

To make full use of said features of this water-soluble polymer, this invention comprises (1) a first water-soluble photopolymer, being a water-soluble resist which can be developed in water, prepared by compounding the aqueous solution of this water-soluble polymer with radiation sensitive chemicals, for example, a water-soluble substance manufactured by a diazo group, an azide group, a cinnamoyl group, an acrylate group, a cinnamiliden group, double bond, an epoxy group, a triple bond, a chloromethyl group, an iodomethyl group, a silicon-silicon single bond, a silicon-silicon double bond, a carbon-carbon single bond or a carbon-sulfur single bond;

(2) a second water-soluble photopolymer capable of laminating a water-soluble organic film made of water-soluble polymer being synthesized with a substance to absorb light of 500 nm in wavelength, such as a naphthoqunone diazide, an aromatic bisazid compound and a water-soluble pigment, and a crosslinking chemical such as dialdehyde starch, a bichromate, a diazide compound, an azide compound and an aldehyde compound, a synthetic product of said water-soluble organic film with catalyst, such as an alkaline aqueous solution including a sodium hydroxide solution and tetramethyl hydroxide ammonium, and an organic solvent resist synthesized from said synthetic solution with epoxy compound, such as epichlorohydrine and epibromohydrine, and (3) a third water-soluble photopolymer possessing the contrast enhancing effect made of a water-soluble polymer aqueous solution based on a water-soluble polymer prepared by mixing with chemicals having a bleaching action or a color fading action to radiation, such as a compound of an novolak resin and a naphthoquinonediazide compound, a diazo compound, an azide compound, a cinnamoyl compound, an acryloyl compound, a cinnamiliden compound, a double bond, an epoxy compound, a triple bond, a chloromethyl compound, an iodomethyl compound, a silicon-silicon double bond, a carbon-carbon single bond, and a carbon ion single bond.

The present invention also relates to a method of forming a pattern by use of said water-soluble photopolymer (water-soluble resist, water-soluble organic film, and contrast enhancing photopolymer), being characterized by a step of a pattern forming method using said second water-soluble photopolymer in the bottom layer in the second point of the prior art described above in order to simplify the process of the multilayer resist method, and solve the problem of melting between resists in the prior art and prevent the effects of step differences and reflection, a step of pattern forming using said second water-soluble photopolymer in the intermediate layer between the top layer and the bottom layer, and a step of laminating, exposing and developing said second and third water-soluble photopolymers on an ordinary resist or multilayer resist and forming a pattern in a contrast enhanced state with the second and third water-soluble photopolymer being removed automatically after development.

These and other objects are accomplished by use of a water-soluble photopolymer comprising a base polymer which is a water-soluble organic matter produced and refined by a bacterial culture and a water-soluble radiation sensitive chemical. This invention also relates to a water-soluble photopolymer comprising a base polymer which is a water-soluble organic matter produced and refined by bacterial culture, a water-soluble radiation sensitive chemical, and a cross-linking agent. Furthermore, this invention relates to a water-soluble photopolymer comprising a base polymer which is a water-soluble organic matter produced and refined by a bacterial culture, a water-soluble radiation sensitive chemical, a crosslinking agent, and a catalyst. Yet, this invention relates to a water-soluble photopolymer comprising a base polymer which is a water-soluble organic matter produced and refined by a bacterial culture, a water-soluble radiation sensitive chemical, a crosslinking agent, catalyst, and an epoxy compound. Moreover, this invention relates to a base polymer which is a water-soluble organic matter produced and refined by a bacterial culture, and a compound water-soluble photopolymer possessing a bleaching or color facing action with respect to radiation.

In the various embodiments, said water-soluble organic matter contains at least one of a polysaccharide, a protein, a gelatin, a casein, a polyvinyl pyrrolidone, and a polyvinyl alcohol. Said watersoluble organic matter is a polysaccharide (for example, pullulan) expressed in the general formula $(C_6H_{10}O_5)_n \cdot H_2O$.

This invention further relates to a pattern forming method comprising a step of coating a substrate with the water-soluble photopolymer, a step of applying and forming a radiation sensitive resin on the water-soluble photopolymer film, a step of exposing to radiation selectively, and a step of developing and removing said selectively exposed radiation sensitive resin and said water-soluble photopolymer immediately beneath it simultaneously.

This invention also relates to a pattern forming method comprising a step of coating a substrate with radiation sensitive resin, a step of forming said water-soluble photopolymer on said radiation sensitive resin, a process of selectively exposing said radiation sensitive resin and said water-soluble photopolymer, a step of simultaneously developing the double-layer structure composed of said selectively exposed radiation sensitive resin and said water-soluble photopolymer, and a step of removing said water-soluble photopolymer.

Moreover, this invention relates to a pattern forming method comprising a step of coating a substrate with a radiation sensitive resin, a step of forming said first water-soluble photopolymer on said radiation sensitive resin, a step of forming said second water-soluble photopolymer on said first water-soluble photopolymer, a step of selectively exposing said second water-soluble photopolymer, a step of simultaneosuly developing a tri-layer structure comprising said selectively exposed radiation sensitive resin, and first water-soluble photopolymer and second water-soluble photopolymer applied on it, and a step of removing first and second water-soluble photopolymers.

Furthermore, this invention relates to a pattern forming method comprising a step of coating a substrate with an organic film, a step of applying or depositing an inorganic film on said organic film, a step of applying a radiation sensitive resin on said inorganic film, a step of forming said water-soluble photopolymer film possessing a bleaching or color fading action with respect to radiation on said radiation sensitive resin, a step of exposing said radiation sensitive resin to radiation by way of said water-soluble photopolymer film, a step of forming a pattern by developing and melting all or exposed part of said water-soluble photopolymer film and exposed or non-exposed part of said radiation sensitive resin, a step of forming a pattern in said inorganic film by dry etching process possessing anisotropy through said pattern-formed radiation sensitive resin, and a step of forming a pattern by dry etching process possessing anisotropy on said organic film through said pattern-formed inorganic film.

Still, this invention relates to a pattern forming method comprising a step of coating a substrate with a first radiation sensitive resin, a step of irradiating the entire surface of said first radiation sensitive resin with radiation, a step of coating said fully irradiated first radiation sensitive resin with a second radiation sensitive resin, a step of forming said water-soluble photopolymer film possessing a bleaching or color fading action with respect to radiation on said second radiation sensitive resin, a step of exposing said first and second radiation sensitive resins to radiation through said water-soluble photopolymer film, and a step of developing and melting the exposed parts of said water-soluble photopolymer film, and first and second radiation sensitive resins.

In addition, this invention relates to a pattern forming method comprising a step of coating a substrate with a first radiation sensitive resin, a step of coating said first radiation sensitive resin with a second radiation sensitive resin, a step of forming a water-soluble photopolymer film possessing a bleaching or color fading action with respect to radiation on said second radiation sensitive resin, a step of exposing said second radiation sensitive resin to a first radiation through said water-soluble photopolymer film, a step of forming a pattern by developing and melting the exposed parts of said water-soluble polymer film and second radiation sensitive resin, a step of exposing to a second radiation through said second pattern-formed radiation sensitive resin, and a step of developing and melting said second exposed radiation sensitive resin.

This invention provides various advantages, among which are as follows:

(1) A water-soluble photopolymer by use of which the resolution of photolithography may be greatly improved.

(2) A method forming pattern which enables a high resolution of a pattern formed by a photolithography technique.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
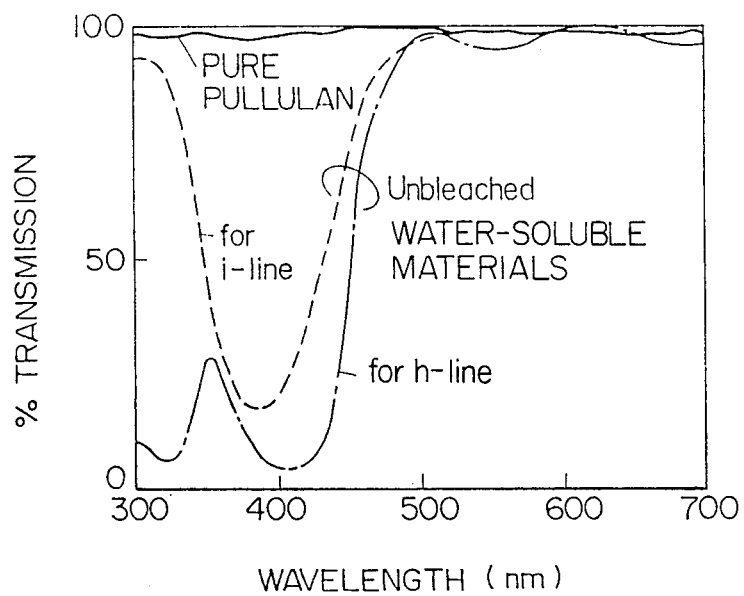
FIG. 1 is an ultraviolet spectral curve of a water-soluble photopolymer according to an embodiment of this invention.

Among various embodiments of this invention, first relating to a water-soluble photopolymer mainly composed of pullulan which is a polysaccharide freely soluble in particular in cold water, this pullulan is a kind of natural polysaccharide being refined biotechnically, and this is, also known as a triglucosaccharide, a viscous polysaccharide being produced outside the organism, that is, within the culture fluid, when *Aureobasidium pullulans*, a kind of black yeast, is cultured under proper conditions using a cane sugar or starch decomposition product as carbon source and adding peptone or various salts to the culture medium. The structure of pullulan is as follows.

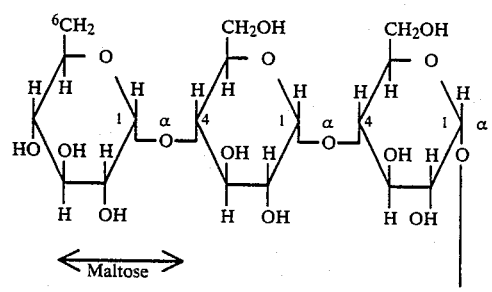

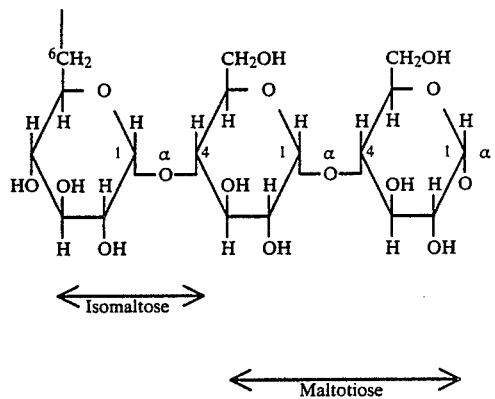

←— Isomaltose —→

←————— Maltotiose —————→

That is, the structure of pullulan is an orderly α-1, 6 bonding of maltotriose (three molecules of glucose being α-1, 4 bonded), and this substance is widely used in food processing, general industrial, cosmetics, pharmaceuticals and biochemical fields.

This pullulan differs in molecular structure from other polysaccharides based on glucose units, such as starch and cellulose. For instance, starch and cellulose is hardly soluble in cold water, while pullulan is freely soluble in cold water, and its aqueous solution is one of the lowest viscosity aqueous solutions of water-soluble high molecules at the same concentration and the same molecular weight. Moreover, the aqueous solution of pullulan is stable for a long period of time, and is completely free of gelation or aging phenomenon. Furthermore, its film is not dissolved in organic solvent at all. That is, it possesses the property to permit repeated application of radiation sensitive resin (that is, resist) of organic solvent system used in the technique of lithography in semiconductor manufacturing process.

Materials or dyes which absorb radiation, for example, ultraviolet rays are dissolved in said pullulan aqueous solution. At this time, although the dyes are acidic, the pullulan aqueous solution remains as a stable aqueous solution without being affected by pH.

It is one of the characteristics of this invention that a small portion of dialdehyde starch or the like is mixed as a crosslinking agent in order to control the dissolving speed of pullulan film in a developing fluid (an alkaline aqueous solution) and rinsing fluid (water) in the developing process of pattern formation of the resist. The dialdehyde starch is prepared by oxidizing starch with periodic acid and replacing the constituent unit of starch with dialdehyde. This dialdehyde starch reacts with said pullulan to form an acetal bond, and is hardly soluble in water.

Similarly, to be hardly soluble in water, or to be photosensitive or esterify or etherify, it may be possible to react said pullulan with a dichromate, a diazide compound, an acid compound (for photosensitiveness), or an aldehyde compound.

Embodiments are described in further details below.

(EMBODIMENT 1)

Purified water (deionized water) was put into a beaker by 100 cc, and, keeping it at room temperature, 10 gram of pullulan with mean molecular weight of 39,000 sufficiently being rid of heavy metals was gradually added and dissolved by stirring.

Furthermore, 25 gram of naphthoquinone diazide sulfonate was dissolved in this pullulan aqueous solution, and a pattern forming organic material was synthesized. This material was applied by rotation on a silicon substrate, and a film of 1.0 μm was obtained. Thereafter, a desired pattern was exposed by ultraviolet rays and developed to melt only the exposed parts, and a pattern possessing an excellent line width controllability with resolution of 1.0 μm was obtained. Incidentally, when this pattern was baked at 200° C. for 30 minutes (in an oven), the pattern was not deformed.

(EMBODIMENT 2)

A pullulan aqueous solution was prepared in the same manner as in embodiment 1. In this solution, 5 gram of a chemical having a composition of

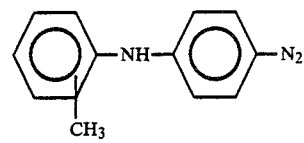

was dissolved, and a pattern forming organic material was synthesized. Using this material, by exposing with ultraviolet rays mainly in the vicinity of 365 nm wavelength, a favorable pattern was formed, similar to the one obtained in Embodiment 1, and its heat resistance was equally excellent.

(EMBODIMENT 3)

A pullulan aqueous solution was prepared in the same manner as in embodiment 1. In this solution, 5 gram of a chemical having a composition of

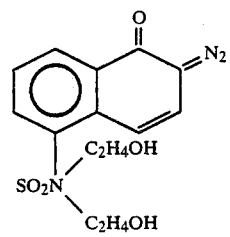

was dissolved, and a pattern forming organic material was synthesized. A film was formed from this material in the same manner as in Embodiment 1, and it was exposed with ultraviolet rays mainly in the vicinity of 365 nm wavelength, and a favorable pattern as in Embodiment 1 was obtained, and its heat resistance was equally excellent.

(EMBODIMENT 4)

Using 5 gram of a chemical having a composition of

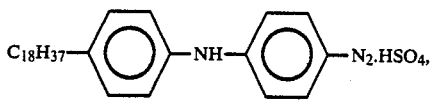

it was caused to react with the same pullulan aqueous solution as in Embodiment 1, and a film was formed, and it was irradiated with ultraviolet rays mainly in the vicinity of 340 nm wavelength, and a favorable pattern as in Embodiment 3 was formed. This film was rigid, and its heat resistance was as excellent as that in Embodiment 1.

(EMBODIMENT 5)

A pullulan aqueous solution was prepared in the same manner as in Embodiment 1. In this solution, 5 gram of a chemical having a composition of

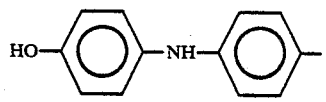

$N_2.HSO_4$ was dissolved, and a pattern forming organic material was obtained. Using this material, a film was formed, and it was exposed with ultraviolet rays mainly in the vicinity of 350 to 400 nm, and a favorable pattern as in Embodiment 1 was formed, and its heat resistance was equally excellent.

(EMBODIMENT 6)

A pullulan aqueous solution was prepared in the same manner as in Embodiment 1. In this solution, 5 gram of a chemical having a composition of

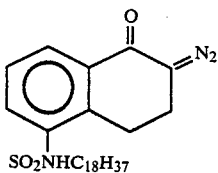

was dissolved, and a pattern forming organic material was synthesized. A film was formed by using this material, and was exposed with ultraviolet rays mainly in the vicinity of 376 nm, and a favorable pattern same as in Embodiment 1 was formed, and its heat resistance was equally excellent.

(EMBODIMENT 7)

Purified water (deionized water) was put in a beaker by 100 cc, and, keeping at room temperature, 20 gram of pullulan with mean molecular weight of 200,000 sufficiently being rid of heavy metals was gradually added and dissolved by stirring. In 100 cc of warm water at 80° C., 2.5 gram of acid dye (the material capable of absorbing ultraviolet region of 500 nm or less) was dissolved while being stirred. Mixing pullulan aqueous solution and dye aqueous solution, a pullulan aqueous solution containing dye was prepared. Then, several milliliters of dialdehyde starch aqueous solution (10%) was mixed in this pullulan aqueous solution containing dye. In this state, gelation was not observed, and the quality was unchanged during long-period storage. When this solution was applied on a quartz glass plate by rotating at 3,000 rpm by means of a spinner, a uniform 5,000 Å film thickness was obtained, and the ultraviolet transmission was less than 50% at wavelength of 500 nm or less, and a sufficient reflection preventive effect against ultraviolet exposure in semiconductor production was obtained. Furthermore, when this water-soluble organic film was applied and then a resist was applied on this organic film, the resist could be laminated quite easily without any melting trouble. The speed of dissolution in water was about ten times as slow as that without the crosslinking agent, and the controllability in semiconductor production was sufficient.

Meanwhile, the contents of pullulan, dye and crosslinking agent may be freely selected according to the film thickness, ultraviolet absorption, or speed of dissolution in water. Besides, to control the solubility in water, it may be possible to etherify or esterify the pullulan itself.

(EMBODIMENT 8)

Purified water (deionized water) was put in a beaker by 100 cc, and, keeping at room temperature, 20 gram of pullulan with mean molecular weight of 200,000 being sufficiently rid of heavy metals was added and dissolved by stirring. As a substance to be sensitized to ultraviolet rays, 100 cc of naphthoquinone diazide sulfonicchloride solution was mixed in said pullulan aqueous solution, and the two reacted quickly. Then as an agent to control the speed of dissolution in water, 10 cc of dialdehyde starch aqueous solution (10%) was added to said reaction solution together with 10 cc of epichloro-hydrine as an agent to control the speed of dissolution in alkali and 100 cc of tetramethyl hydroxide ammonium as catalyst, and the mixture was stirred violently and let stand for about 24 hours until completely dissolved.

Said dialdehyde starch aqueous solution was used to control the speed of dissolution of pullulan into water, and epichloro-hydrine and tetramethyl hydroxide ammonium were used to control the speed of dissolution of pullulan into alkaline aqueous solution. That is, dialdehyde starch reacts with pullulan to form acetal bond which is hardly soluble in water, while epichlorohydrine and tetramethyl hydroxide ammonium are compounded to form diol, which reacts with said excess dialdehyde starch aqueous solution to from acetal bond to prevent the excess dialdehyde starch aqueous solution from being dissolved in alkaline aqueous solution.

The aqueous solution after 24-hour standing did not contain gel and was stable qualitatively. It already possessed photosensitiveness, and formation of fine positive pattern was possible.

(EMBODIMENT 9)

As a method of controlling the dissolution of pullulan into water, it may be possible to introduce a crosslinking agent. That is, the aldehyde group represented by dialdehyde starch reacts with the OH group of pullulan to form acetal bond which is hardly soluble in water.

Furthermore, the purpose of controlling the dissolution speed into alkaline aqueous solution was achieved by mixing epoxy hydrine, a compound possessing an epoxy group, and an alkaline aqueous solution, for example, tetramethyl hydroxide ammonium. That is, epichlorohydrine was turned into diol by tetramethyl hydroxide ammonium, and it reacted with said excess dialdehyde starch aqueous solution to form acetal bond, thereby preventing the excess dialdehyde starch aqueous solution from being dissolved in alkaline aqueous solution.

Specifically, purified water (deionized water) was put in a beaker by 100 cc, and 20 gram of pullulan with mean molecular weight of 200,000 being sufficiently rid of heavy metals was gradually added and dissolved by stirring. On the other hand, 5 gram of acid dye (the material capable of absorbing an ultraviolet region of 500 nm or less) was dissolved in 100 cc of warm water at 80° C. while being stirred. Mixing the pullulan aqueous solution and dye aqueous solution, a pullulan aqueous solution containing dye was prepared. Then several milliliters of dialdehyde starch aqueous solution (10%) was mixed into the pullulan aqueous solution containing dye. In addition, 200 cc of tetramethyl hydroxide ammonium (with alkaline normality of about 0.3) was mixed, and 10 cc of epichlorohydrine was introduced, and the mixture was stirred violently, and let stand for 24 hours (at room temperature).

This pattern forming organic film was, after being washed in water, completely free of turbidity, sediment or gelation.

When this solution was applied on a quartz glass plate by rotating at 3000 rpm by means of a spinner, a uniform 3000 Å film thickness was obtained, and the ultraviolet transmission was less than 20% at wavelength of 500 nm or less, and a sufficient reflection preventive effect against ultraviolet exposure in semiconductor production was obtained. Furthermore, when this pattern forming organic film was applied and a resist was then applied on this organic film, the resist could be laminated quite easily without any melting problem. The speed of dissolution in water or alkali was several times as slow as that of a pure pullulan film, and a controllability of pattern formation was sufficient.

Incidentally, the contents of pullulan, dye, dialdehyde starch, tetramethyl hydroxide ammonium, and epichlorohydrine could be freely selected by the coating film thickness, ultraviolet spectrum, and dissolution speed into water and alkali.

(EMBODIMENT 10)

A base polymer is synthesized with novolak resin, orthoquinonediazide sulfonylchloride and acid catalyst at high temperature and high pressure, and the product is dissolved xylene, ethylcellusolve acetate solvents to be refined. At this time, when the content of the synthetizer, that is, orthonaphthoquinonediazide sulfonylchloride was set to more than 30 wt. % of the solution, for example, 50 wt. %, said exposure absorption dependent term A value was 3.9 at T(c) of 10%, T(∞) of 70% and film thickness of 0.5 μm. By contrast, for example, that of an ordinary positive resist is about 0.8. This refine solution was not aged or gelled.

The material of synthesizer is not limited to the substance in this embodiment alone, and any material of diazide compound system may be used.

(EMBODIMENT 11)

A base polymer was mixed with a water-soluble polymer, for example, pullulan, by dissolving 10 gram in 100 cc of water. A cationic dye or diazo compound possessing fading property of a yellow hue absorbing from 450 nm to 350 nm was dissolved by about 0.2 gram. At this time, the aqueous solution was very clean without any gel or insoluble matter. When this solution was applied in a thickness of 0.35 μm, the transmission was T(c) of 5% and T(∞) of 90%, and the value of A was as high as 8.25.

Examples of the water-soluble polymer include polysaccharides, protein, polyvinyl pyrrolidone and polyvinyl alcohol.

Characteristics of the film of this embodiment synthesized by matching practical ultraviolet spectral characteristics at each wavelength are shown in FIG. 1, which also shows the characteristics of pure pullulan film.

Figure 2:
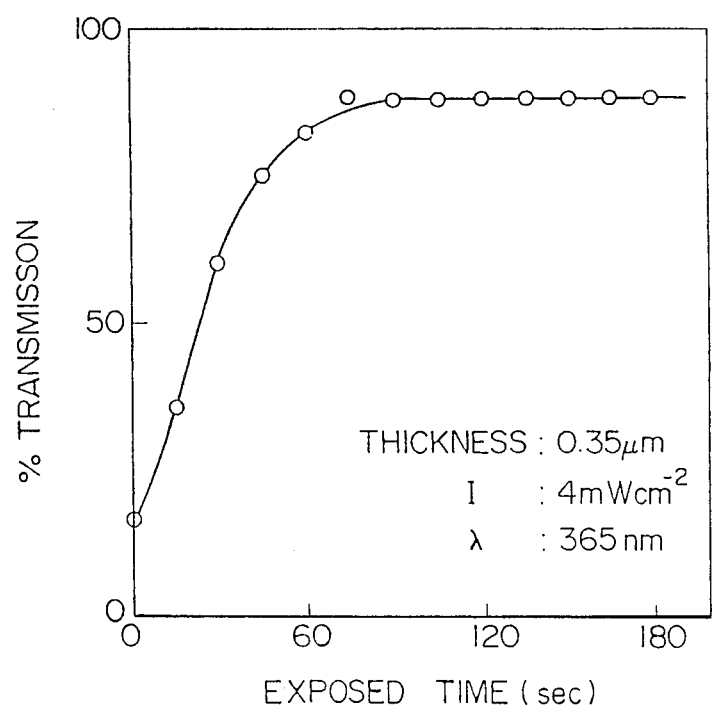
FIG. 2 shows a bleaching characteristic of water-soluble photopolymer according to an embodiment of this invention.

Meanwhile, the minimum peak value of transmission is determined by the content of the bleaching chemical possessing bleaching action. On the other hand, the pure pullulan is free of absorption peak in almost all wavelength region, and presents an excellent transparency. At the present, the materials of respective chemicals are selected with respect to spectral g-, h-, i-lines, but it is naturally possible to obtain a broad range of absorption spectrum depending on the selection of chemicals. FIG. 2 shows the bleaching characteristic of contrast-enhanced water-soluble photopolymer for synthesized i-line. This curve is for i-line (365 nm), and an excellent contrast enhancing effect showing a linear bleaching performance and possessing high transparency after bleaching is expected.

To apply a synthesized water-soluble polymer mentioned in the embodiment into CEL process or other pattern forming process, its thermal characteristics, particularly, stability to heat, are required. Specifically, since a positive resist before pattern forming is used in the bottom layer, the process must be completely without lowering its own sensitivity. It is easily predicted that the fluctuation of sensitivity of water-soluble photopolymer itself, in particular, variation of bleaching characteristic by heat, greatly determines the patterning precision in the submicron region, and a strict stability against heat is required as the material for lithography. In the first place, as a result of thermal gravity analysis of the formed film of pure pullulan, the loss starting temperature was as high as 297° C., which suggested an excellent heat resistance.

Figure 3A:
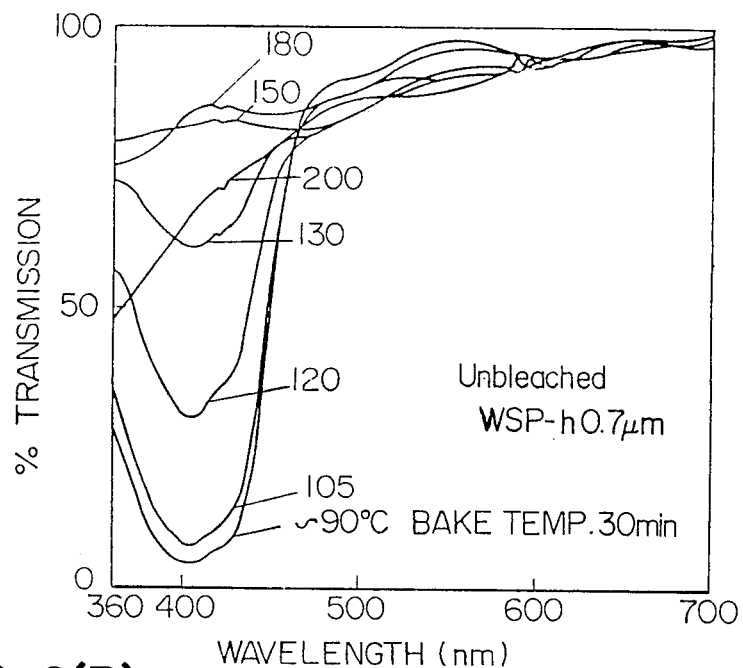
FIGS. 3, 4 shows the heat treatment dependence of ultraviolet spectral curve before and after bleaching of a water-soluble photopolymer according to an embodiment of this invention.
Figure 3B:
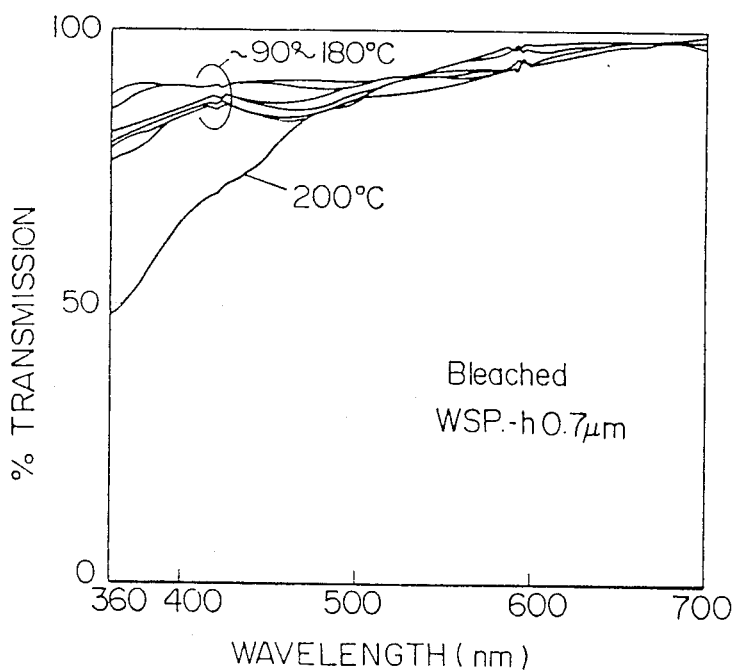
Figure 4:
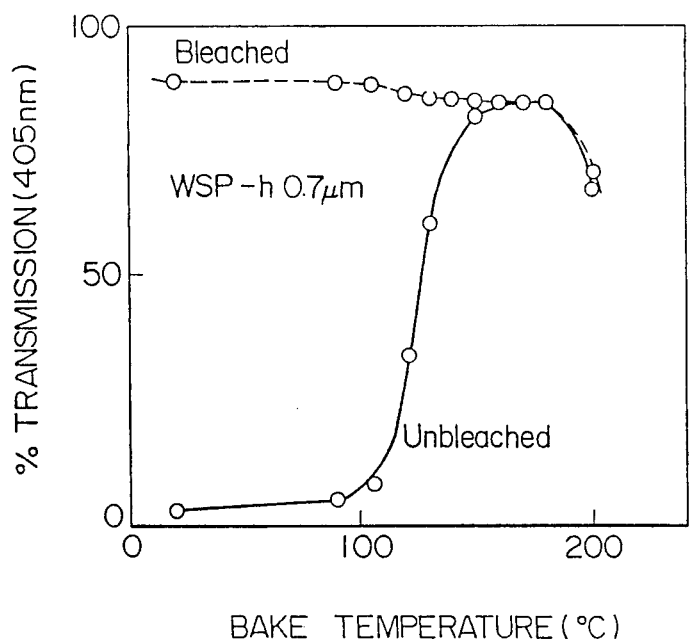

On the other hand, since the trial product of water-soluble photopolymer was composed of main polymer and light bleaching chemical, it is necessary to observe the behavior of bleaching characteristic particularly in low temperature region of light bleaching chemical. FIG. 3(A) shows the ultraviolet spectral characteristic before bleaching of water-soluble photopolymer-h (for 405 nm) experimentally manufactured in an ordinary oven. The absorption did not deteriorate from room temperature to about 105° C., but the absorption peak varied significanlty at 120° C. and higher temperature, and the transmission reached the maximum at the baking temperature of 180° C. And a lowering tendency was noted at 200° C. On the other hand, FIG. 3(B) records the spectral characteristic after bleaching. In this case, the transmission did not drop in a range of room temperature to 180° C., which suggests that the cause is the lowering of sensitivity of the mixed light bleaching chemical. By heat treatment at 200° C., it seems a reaction occurred between some pullulan and light bleaching chemical. The characteristics in FIGS. 3 (A), (B) are summarized in FIG. 4 as the transmission with respect to heat treatment at the wavelength of 405 nm. In a temperature range of 105° C. to 180° C., fluctuations of bleaching characteristic occur, and it may be concluded that deterioration of the entire film with respect to bleaching occurs at 200° C. and higher temperature. Accordingly, the water-soluble photopolymer may be stably applied in a heat treatment process at a temperature of up to 100° C.

When applying the water-soluble photopolymer in a CEL process, by utilizing the property of water solubility of pullulan as the main polymer, it is possible to omit the removal process of CEL film in the process conventionally proposed by Griffing et al. As is well known, the developing solution of ordinary diazoquinone positive photoresist is an alkaline aqueous solution (organic amine system), and water is used as rinsing fluid. Therefore, when developing the positive resist, it is dissolved in said alkaline aqueous solution and water, and is automatically removed by the aqueous solution. While the novel CEL process of this invention is described later, the solubility is discussed in the following paragraph.

Figure 5A:
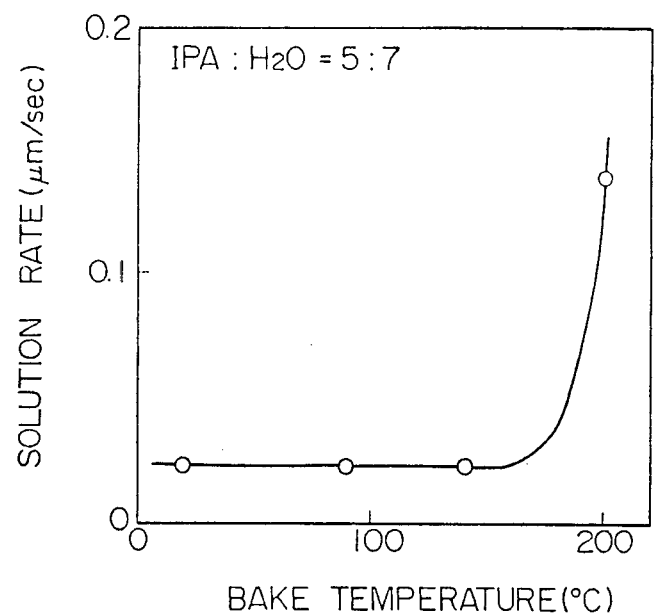
FIG. 5 is a diagram representing the melting performance by heat treatment temperature and the exposure amount of a water-soluble photopolymer according to an embodiment of this invention.
Figure 5B:
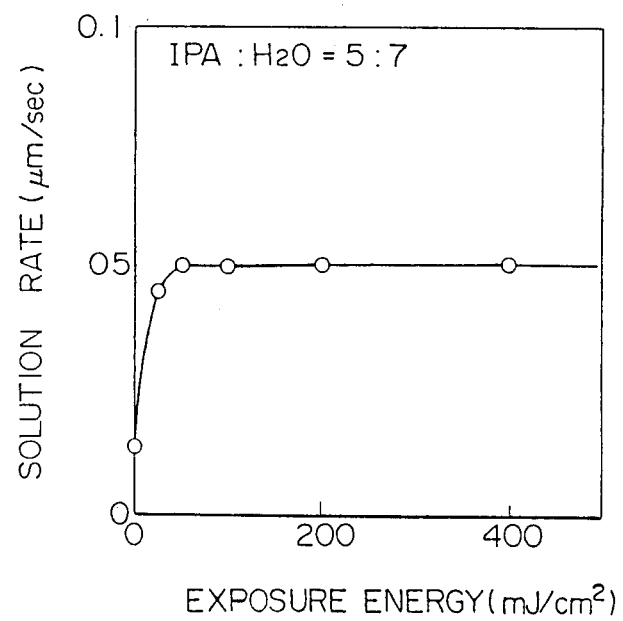

The dissolved solution used in the experiment is also used actually. It may be ideal to evaluate by using alkaline developing solution or water, but since water-soluble photopolymer is dissolved in both solvents in several seconds, it is practically difficult to quantitatively determine the actual amount of dissolution. Accordingly, making use of the insolubility of pullulan in organic solvent, a diluted isopropyl alcohol aqueous solution was used in the experiment, and the dependency on heat treatment temperature and exposure quantity was evaluated. However, since said aqueous solution is used, the dissolved quantity seems to be greater than that in actual water. FIG. 5(A) shows the solution rate in terms of heat treatment temperature. Similar to the spectral curve in relation to heat treatment discussed above, the solution rate increased from around 140° C., of which cause is considered to be reaction between main polymer and light bleaching chemical, but since the solution rate was stable around 100° C., there was no effect of light bleaching chemical on the solution rate. The relation between solution rate and exposure energy is shown in FIG. 5(B). Evidently, the solution rate increased as the exposure energy became larger, and was stablized after bleaching reaction. This phenomenon itself had few effects on the process, in particular, the development of positive resist, but by positively making use of this phenomenon, for example, that is, by increasing the sensitivity to such an extent that the solution rate in water may not be lowered, for instance by imparting with a weak molecular bonded state, an effective surface induction phenomenon may be applied to the positive resist at the time of development, and an excellent pattern profile is expected. Thus, also relating to solubility, it is known that the water-soluble photopolymer possesses a stable property in photolithographic process same as in said heat treatment process.

Figure 6:
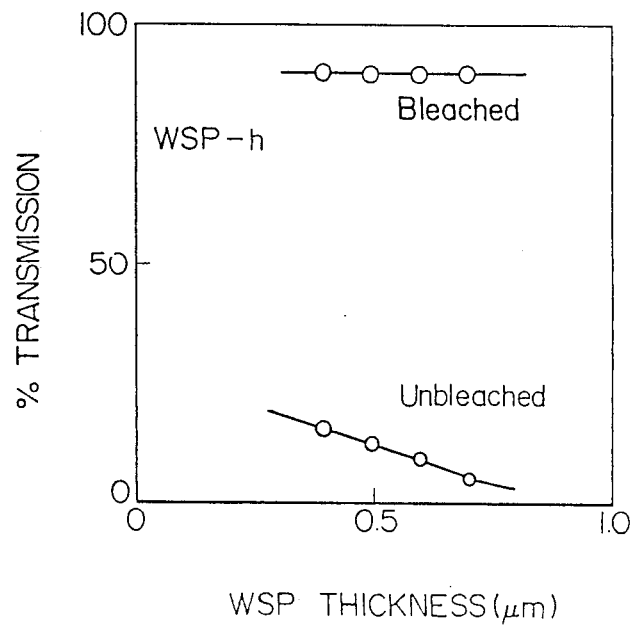
FIG. 6 shows the transmission before and after bleaching due to the film thickness of a water-soluble photopolymer according to an embodiment of this invention.

The initial transmission and final transmission before and after bleaching at various film thicknesses of water-soluble photopolymer are shown in FIG. 6. The initial transmission was dependent on the film thickness, and it is necessary to find the optimum exposure quantity, in the actual process, depending on the fluctuations of film thickness of water-soluble photopolymer.

An embodiment of pattern forming method using water-soluble photopolymers for prevention of reflection in foregoing Embodiments 7, 8, 9 is described below.

(EMBODIMENT 12)

In FIG. 7, steps 12 of insulators or the like are formed on a semiconductor substrate 10, and a high reflectivity metal film, for example, an Al film 14 serving as wiring is evaporated. Then said water-soluble photopolymer for prevention of reflection 16 is applied (A). At this time, the coat thickness of this water-soluble photopolymer 16 is properly set depending on the quantity of energy applied at the time of exposure, but in this embodiment, it was thinly applied in a thickness of 2000 Å.

In succession, a positive type UV resist 18 is applied on the water-soluble photopolymer 16. At this time, the resist 18 and photopolymer 16 could be applied uniformly without any mutual dissolution (B).

This is exposed with ultraviolet rays 24 of 436 nm by reduced projection exposure method with an energy of 150 mJ/cm$^2$ through a chrome pattern 22 of photo mask 20. At this time, since reflections from the step side or surface are fully absorbed by the water-soluble photopolymer for prevention of reflection 16, no reflection occurs at all, and an unexposed region 18a is formed exactly after the chrome pattern 22 (C).

Finally, the irradiated positive type UV resist 18 is developed and removed in alkaline developing solution, while the exposed photopolymer film is removed in the rinsing process, and patterns 18b, 16a are obtained (D).

The solution rate of water-soluble photopolymer film 16 into water can be freely controlled by heat treatment after coating and addition of crosslinking agent, and it is set by the coat thickness of positive UV resist 18 in the top layer.

Figure 7A:
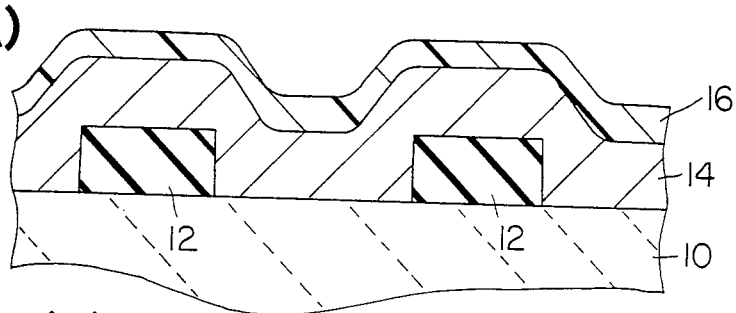
FIGS. 7, 8 illustrate the pattern forming method of double-layer structure using a water-soluble photopolymers according to an embodiment of this invention.
Figure 7B:
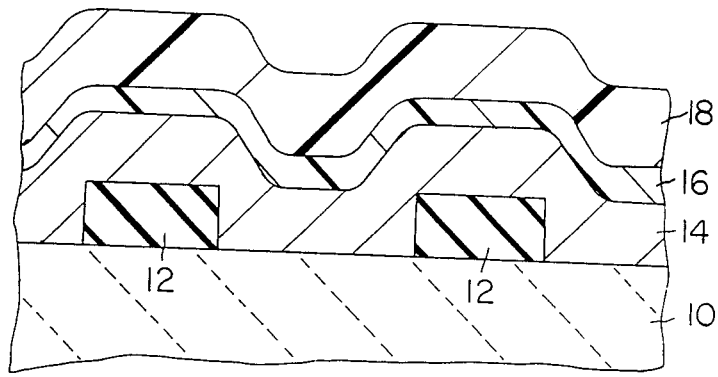
Figure 7C:
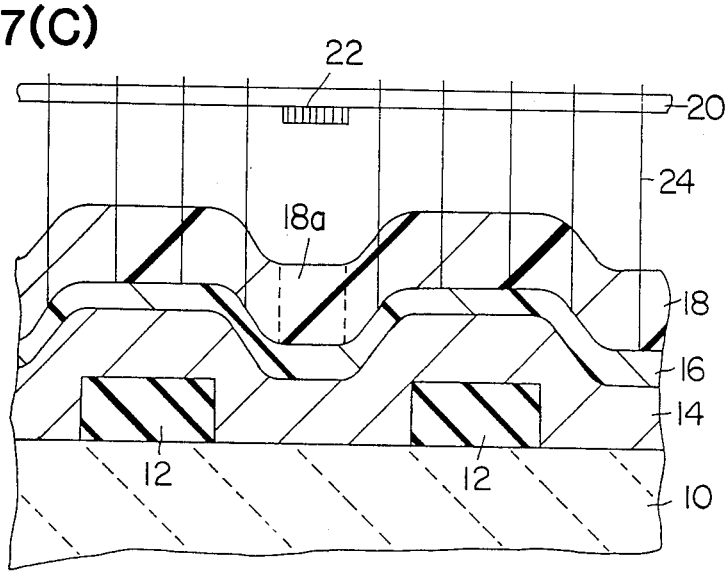
Figure 7D:
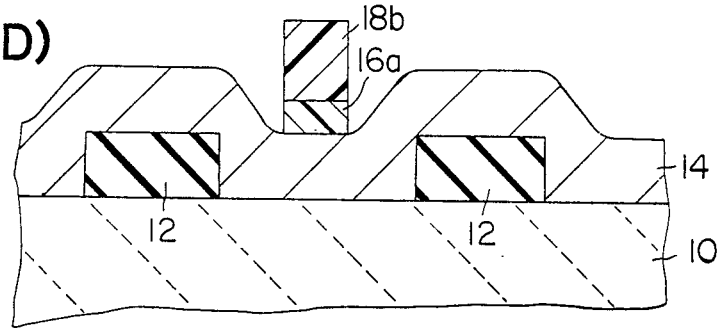

After FIG. 7(D), using patterns 18b, 16a as masks, the Al film 14 is selectively removed, and the electrode wirings are formed.

(EMBODIMENT 13)

Figure 8A:
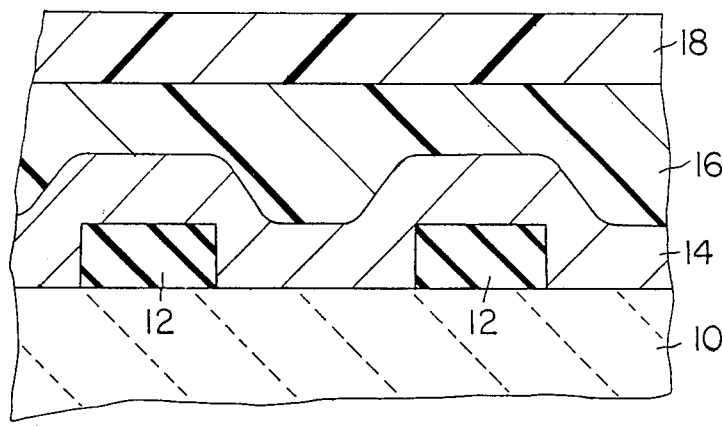
Figure 8B:
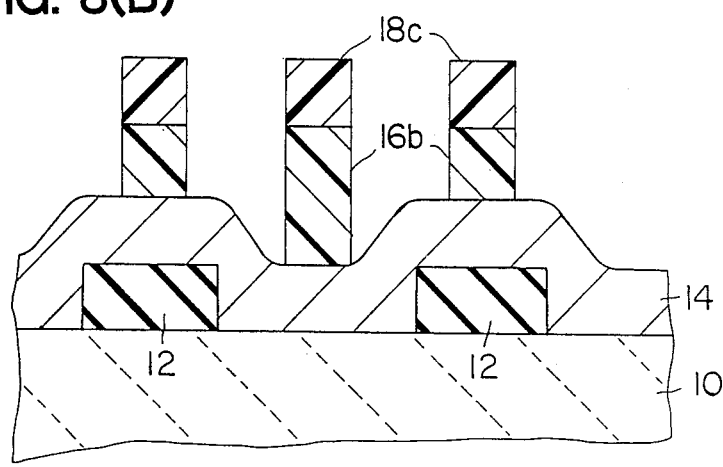

Referring now to FIG. 8, by contrast to Embodiment 12 wherein the photopolymer film 18 was set at the minimum thickness to prevent reflected light of the exposure energy, and the shape of the step 12 on the base substrate 10 was not changed, and the positive type UV resist 18 varied in the film thickness in the vicinity of step, and the pattern precision deteriorated finally, in this embodiment, to prevent this, the water-soluble photopolymer film for prevention of reflection 16 is applied thickly and formed flatly (A). Afterwards, since the positive type UV resist is applied flatly, variation of the resist film thickness is completely eliminated. After the subsequent exposure, development, and rinsing processes, as shown in FIG. 8(B), patterns 18c, 16b of high pattern precision and high aspect ratio were obtained. At this time, since the photopolymer film 16 was baked at low temperature and the crosslinking agent was added by a proper content, the solution rate in water was great, not much depending on the film thickness, so that the positive type UV positive resist pattern 18c in the top layer could be transferred correctly.

Figure 9:
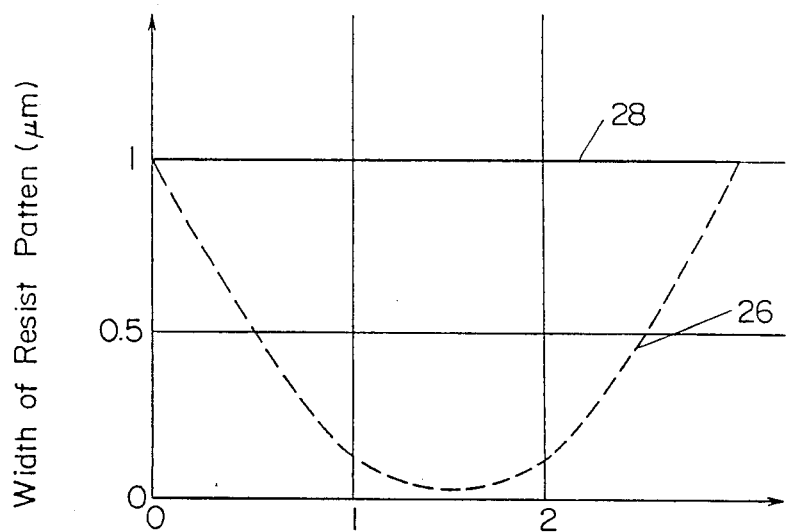
FIG. 9 is a graph representing the relation between the distance from the stepped part and the pattern width in a pattern forming method of a double-layer structure using a water-soluble photopolymer according to an embodiment of this invention.

Practically, the experimental data by this embodiment is shown in FIG. 9. The axis of abscissas refers to the distance S from the step edge to the chrome pattern edge of mask, while the axis of ordinates denotes the resist pattern after pattern forming. This is a transfer of mask pattern. According to this result, curve 26 represents a conventional example, wherein at S (distance from step) of 1 to 2 μm the resist pattern is broken or nearly broken due to reflection from the base A1. For instance, when S is 0.5 μm, the resist pattern was 0.5 μm, showing a thinning tendency. By contrast, curve 28 of this embodiment shows a uniform pattern of 1 m without any variation in the resist pattern, regardless of the distance S.

A positive resist was used in this embodiment, but the same effect will be obtained if a negative resist is used.

(EMBODIMENT 14)

A pattern forming method using a water-soluble photopolymer in embodiment 11 is explained below while referring to FIG. 17. In the first place, a resist 30 is applied on a semiconductor substrate 10 in a thickness of 1.0 to 2.0 μm (A). Then, on this resist 30 is laminated a water-soluble photopolymer film 32 possessing a bleaching or facing action to radiation (B). At this time, melting of the lower layer of resist 30 and upper layer of photopolymer film 32 was not observed at all. This is selectively exposed 34 by the reduced projection exposure method by ultraviolet rays (C). At this time, the incident light is Fourier-transformed, the contrast value C deteriorates. For example, when the NA (numerical aperture) at 436 nm was 0.32, the contract value C after passing through a mask of 0.6 μm line and space was 50%, and normal resolution was not obtained. However, when A parameter of the photopolymer film 32 was set at 5, the incident light of 50% contrast passing through the film was enhanced to 70% contrast, and entered the lower resist layer 30. Thereafter, when developing the resist layer 30 in a developing solution, for example, alkaline developing solution, the entire photopolymer film 32 was dissolved instantly. When this development was continued, part of the resist layer 30 being photosensitized by the contrast-enhanced incident light was developed and removed (D). As a result, 0.5 μm line-and-space pattern could be clearly resolved.

Meanshwile, this invention is not limited to free selection of exposure wavelength by matching the bleaching or fading action of the organic film.

Thus, since the water-soluble photopolymer used in this invention possesses an ability of water solubility, the process is extremely facilitated, and through-put is improved, and it has been found that a pattern can be made stably regardless of changes in exposure time or development time.

Figure 12:
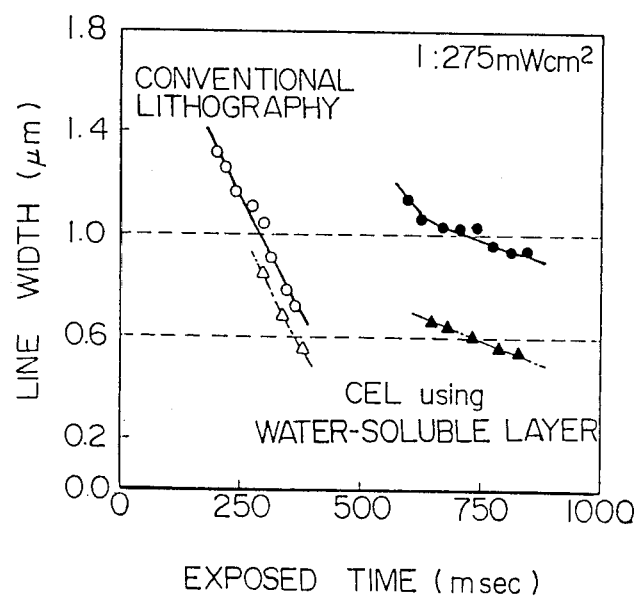
FIG. 12 is a diagram to compare the pattern width controllability and characteristics between an embodiment of this invention and a single-layer resist of the prior art.
Figure 10A:
FIG. 10 is a diagram to explain the pattern forming method of contrast enhanced photolithography using a water-soluble photopolymer according to an embodiment of this invention.
Figure 10B:
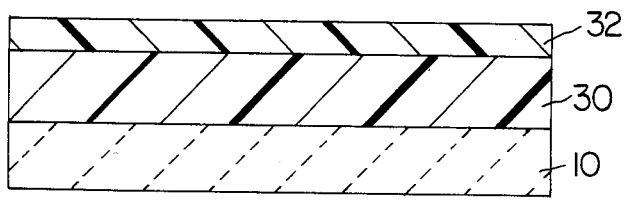
Figure 10C:
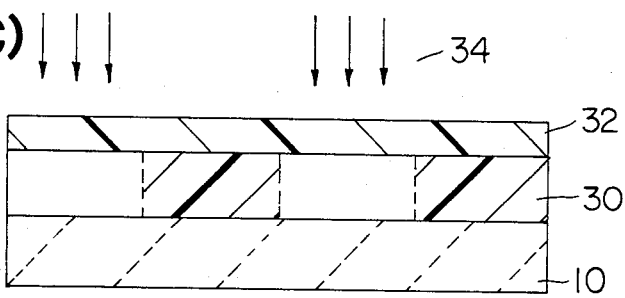
Figure 10D:
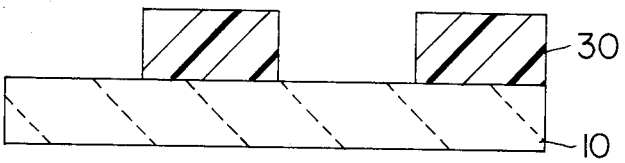
Figure 11:
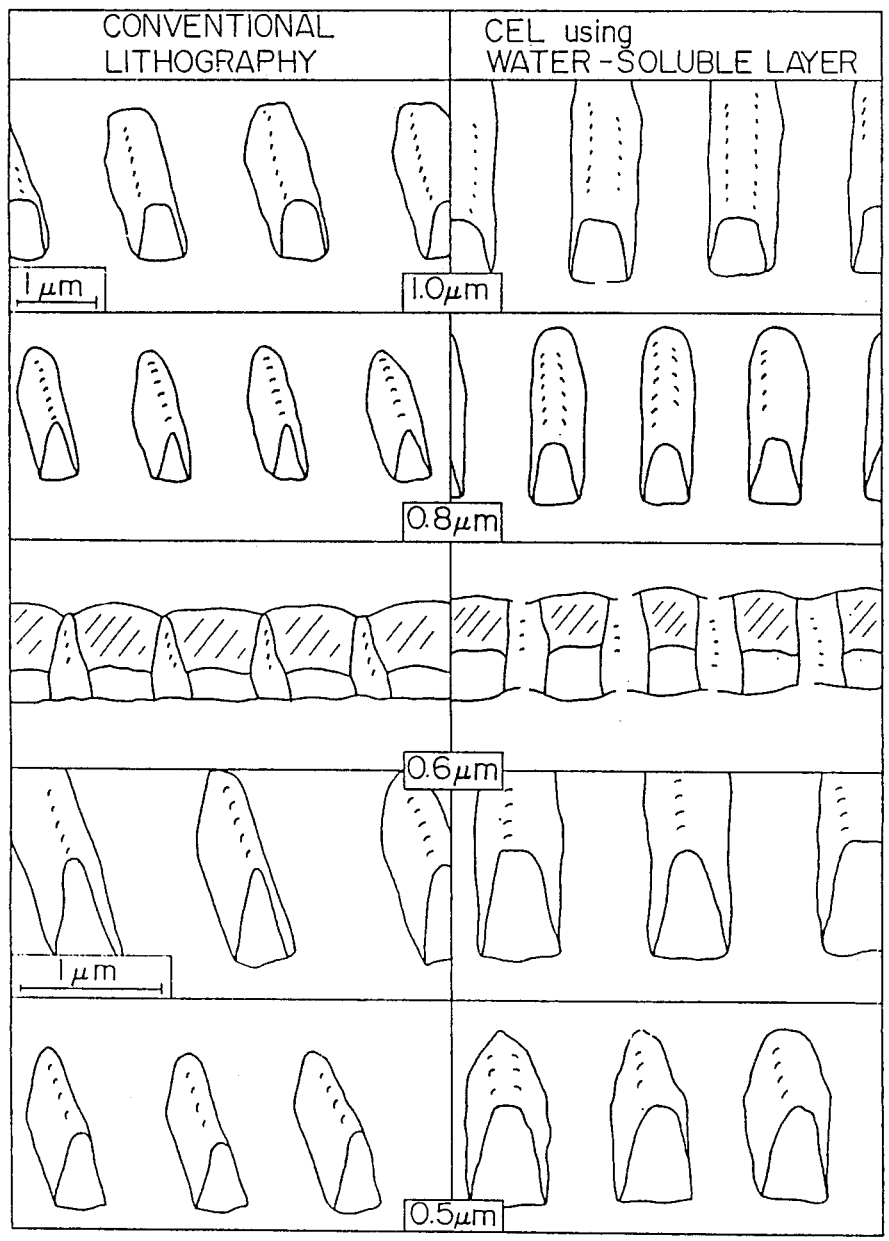
FIG. 11 is a view prepared based upon a pattern SEM picture in the pattern forming method of contrast enhanced photolithography using a water-soluble photopolymer according to an embodiment of this invention.
Figure 13A:
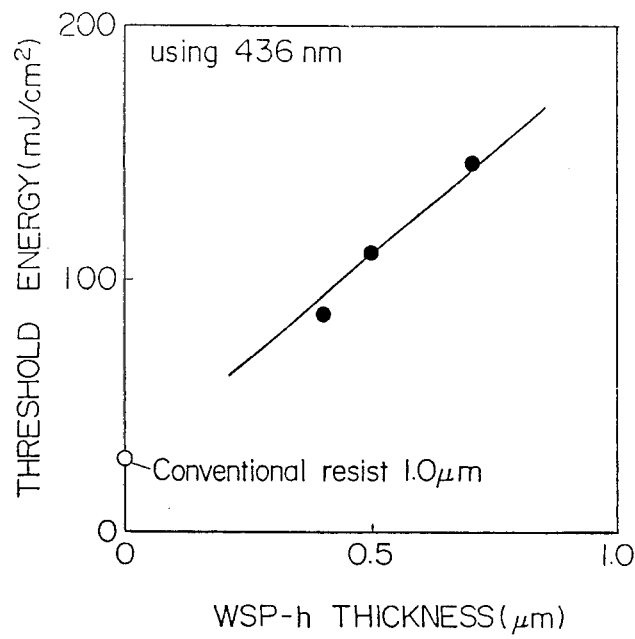
FIG. 13 is a diagram showing the threshold energy property of exposure depending on the film thickness of a water-soluble photopolymer and that of a lower layer resist according to an embodiment of this invention.
Figure 13B:
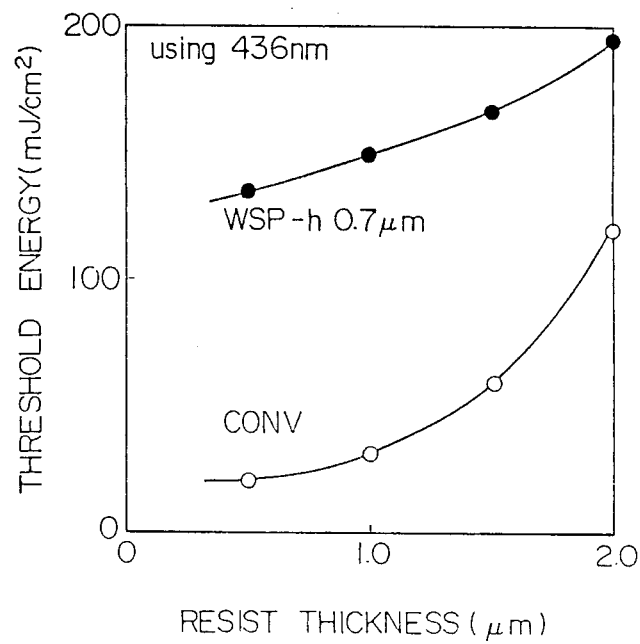
Figure 14A:
FIG. 14 is a diagram to explain the pattern forming method of contrast enhanced photolithography in tri-layer structure using water-soluble photopolymers according to an embodiment of this invention.
Figure 14B:
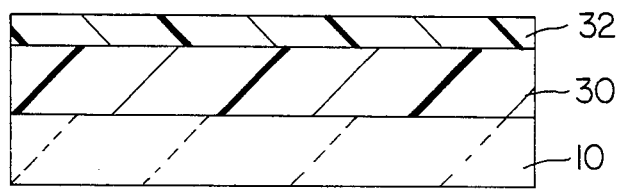
Figure 14C:
Figure 14C:
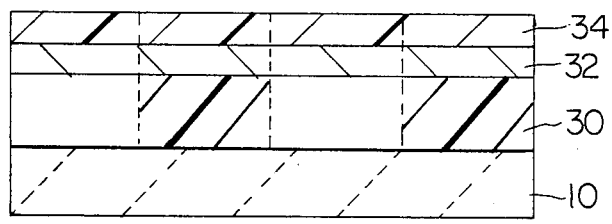
Figure 14D:
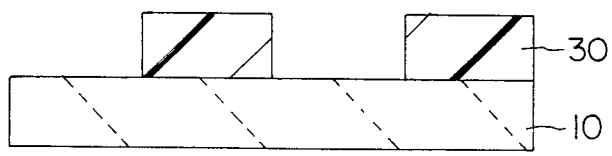
Figure 15A:
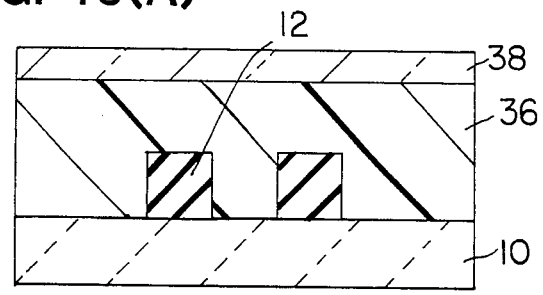
FIGS. 15, 16, 17 are diagrams to explain the pattern forming method using water-soluble photopolymers according to an embodiment of this invention.
Figure 15B:
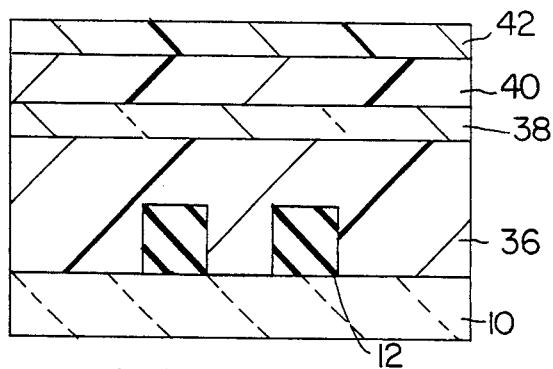
Figure 15C:
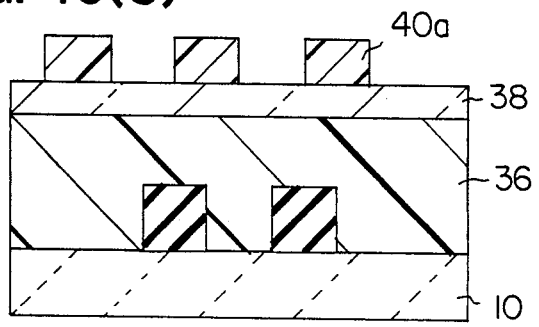
Figure 15D:
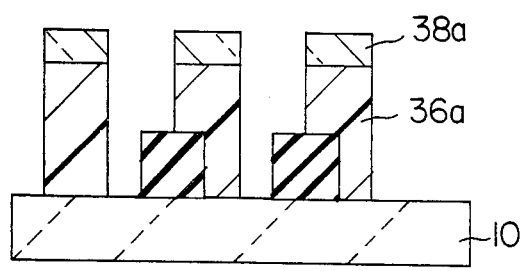
Figure 16A:
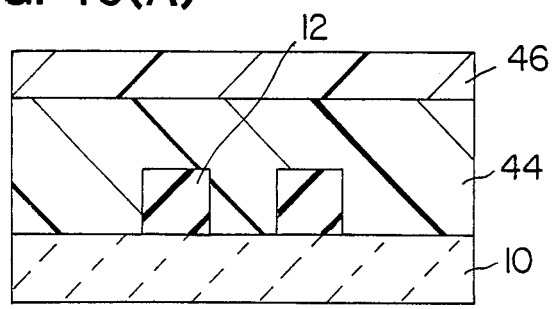
Figure 16B:
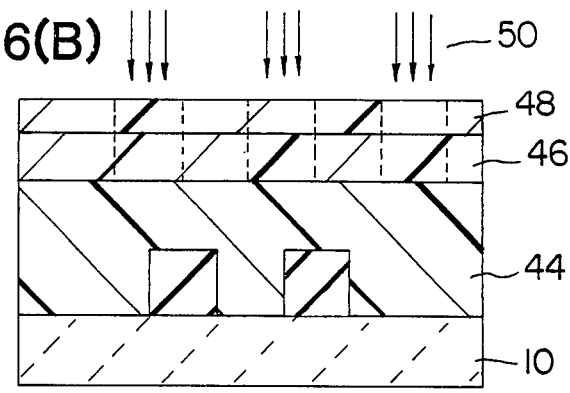
Figure 16C:
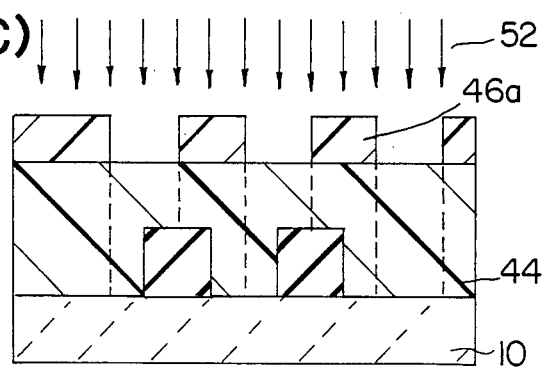
Figure 16D:
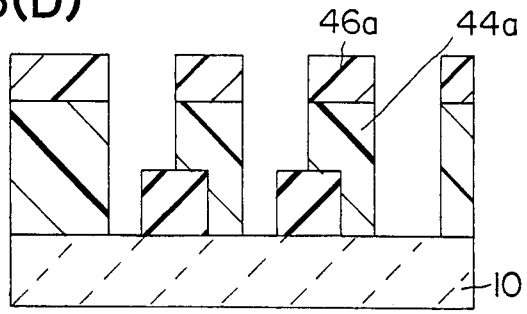

This embodiment 14 is described in further details. A pattern forming method using a synthesized water-soluble photopolymer is shown in FIG. 10. A resist pattern was formed on Si substrate. The positive resist used in this embodiment was MP 1400-27 (manufactured by Shipley), and the film thickness was set at 1.0 μm. The water-soluble photopolymer having a sensitivity peak in i-line (365 nm) was applied by rotation in a thickness of about 0.3 μm to 0.5 μm. At this time, mixing of the photopolymer with the lower layer of positive resist did not occur, and the coating performance was perfect. It was exposed by using the i-line 10:1 wafer stepper (made by Nikon, NA 0.35). After exposure, the water-soluble photopolymer and positive resist were simultaneously developed for 50 seconds in an MF-314 metal-free developing solution (made by Shipley). Considering results of a simulation, the exposure quantity was greater than that of an ordinary positive resist. The development process was continuous because the photopolymer is instantly dissolved in the MF-314 developing solution. FIG. 11 shows a view drawn based upon SEM pictures of L&S resist pattern of positive resist of 0.5 to 1.0 μm by the CEL Process using ordinary positive resist and water-soluble photopolymer. In pattern formation of ordinary positive resist, it was developed for 30 seconds with an exposure energy of 88 mJ/cm$^2$. By SEM observation, it is found, similar to the simulation prediction, that the CEL process using water-soluble photopolymer is greater in the resist shape, in particular, the sectional angle, and smaller in resist film loss, clearly forming as finely as 0.6 μm, and is sufficiently enhanced in the contrast. However, in the 0.5 μm pattern, the resist residue was found in the space area due to lack of exposure, but it is estimated that the resolution be improved by controlling the exposure quantity. The pattern width performance in terms of exposure quantity is shown in FIG. 12. In both 1.0 μm and 0.6 μm patterns, it is evident that the pattern controllability is excellent in the CEL process using the water-soluble photopolymer. FIG. 13 (A), (B) shows the characteristics of threshold energy (defined as the exposure energy to completely dissolve the resist in the infinite space area) in relation to the thickness of water-soluble photopolymer film and lower resist layer. Similar to the simulation result, the threshold energy varied depending on the fluctuation of the photopolymer film thickness, and deterioration of pattern formation on the step, especially, pattern precision is predicated. However, this effect may be considerably lessened by enhancing the optical absorption concentration or raising the sensitivity of lower layer resist, while it may be considered to be compensated sufficiently by the fabrication technology by combining with the flat coating method or multilayer resist method (which will be discussed later). On the other hand, as for the fluctuation of the lower layer resist film thickness, the CEL process using the water-soluble photopolymer is smaller in the variation of threshold energy, and excels in stable pattern controllability evidently.

(EMBODIMENT 15)

A pattern forming method using said tri-layer structure is explained below while referring to FIG. 14. A semiconductor substrate 10 is coated with a resist 30 in a thickness of 1.0 to 2.0 μm (A). A pullulan aqueous solution, for example, being a polysaccharide is applied and formed for lift-off purpose on a water-soluble photopolymer film 32. This coat thickness was set within 0.1 to 0.3 μm so as not to affect the pattern forming (B). A novolak resin 34 with an excess portion of orthonaphthoquinone diazide mentioned in embodiment 10 is formed in a thickness of 0.3 to 1.0 μm (C). Ultraviolet rays are emitted in a desired pattern. Then, the novolak resin 34 with an excess portion of orthonatphthoquinone diazide, water-soluble photopolymer film 32, and resist 30 are simultaneously developed in an alkaline developing solution to form a pattern (D). At this time, when the photopolymer film 32 without pattern forming ability is removed, the top layer of resin 34 is simultaneously lifted off, and only the resist 30 is finally left over in the pattern. At this time, a line-and-space pattern of 0.5 μm could be clearly resolved. In this embodiment, as the resist 30, any material that may be developed in a developing solution of water or alkalihe aqueous solution may be used, and a commonly used diazo group positive resist is a representative one. A water-soluble photopolymer film possessing bleaching or fading action may be also used.

(EMBODIMENT 16)

In FIG. 15, an organic film 36, for instance, a positive resist was flatly applied in a thickness of 2 $\mu$m to 3 $\mu$m on a substrate having steps, for instance, a semiconductor substrate 10, and an inorganic film 38 was applied or deposited in a thickness of 0.1 to 0.2 $\mu$m on said organic film 36, for example, liquid spin-on-glass (S.O.G.) was applied by rotation. At this time, the organic film 36 was baked in a temperature range of 140° C. to 250° C., and the S.O.G. film 38 was heated to about 200° C. (A). Then the inorganic film 36 was coated with an ordinary ultraviolet positive resist 40, such as Shipley's MP 1400-27 in a thickness of 0.5 $\mu$m to 1.0 $\mu$m. And a pattern forming organic film 42 was formed on this resist 40. Examples of water-soluble polymer as the base polymer of this film 42 may include polysaccharides, protein, PVP, and PVA, and in this embodiment, pullulan, a polysaccharide (prepared by Hayashihara Biochemical Laboratory), was dissolved by 10 gram in 100 cc of deionized water, and about 0.2 gram of diazo compound having bleaching action in a wavelength band of 350 nm to 450 nm was also dissolved. The aqueous solution obtained was, of course, water-soluble, and was stable in heat treatment and exposure process. This pattern forming organic film 42 was applied and formed in a thickness of about 0.5 $\mu$m (B).

In consequence, by the reduced projection exposure method, the positive resist 40 was sensitized through pattern forming organic film 42. Then the positive resist 40 was developed in a developing solution, and a resist pattern 40a was formed. At this time, the pattern forming organic film 42 imparted the positive resist 40 with contrast enhancing effect, and instantly dissolved in water and disappeared by itself because it is water-soluble. Furthermore, by the effect of reduction of film thickness of positive resist 40 and CEL effect, a very fine, specifically 0.4 $\mu$m, line-and-space pattern could be formed by an ordinary reduced projection exposure method (C). This patterned positive resist 40a was used as the mask to subject the inorganic film 38 to reactive ion etching (RIE) by the fluorine-type etching gas having an anisotropy, and the etched and patterned inorganic film 38a was used as the mask to subject the organic film 36 to RIE by oxygen-type gas, so that a pattern 36a of high aspect ratio without effect of step was obtained (D).

(EMBODIMENT 17)

In FIG. 16, a far ultraviolet ray resist 44, for example, PMMA having a sensitivity in the vicinity of 300 nm is formed on a substrate 10 having steps 12, flatly in a thickness of 2 to 3 $\mu$m. Then an ultraviolet ray resist 46 having a sensitivity peak in the vicinity of 380 nm is laid over the far ultraviolet ray resist 44 in a thickness of about 0.5 to 1.0 $\mu$m (A). In succession, a pattern forming organic film 48 used in embodiment 1 is applied on the ultraviolet ray resist 46 in a thickness of about 0.5 $\mu$m, and the ultraviolet ray resist 46 is exposed through the pattern forming organic film 48 selectively with ultraviolet rays 50, for instance at 436 nm (g-line), by reduced projection exposure method (B). The ultraviolet ray resist 46 is developed in developing solution, and a pattern 46a is formed. At this time, the pattern forming organic film 48 is automatically removed. Using this patterned ultraviolet ray resist 46a as mask, that is, as wavelength filter, the entire surface is exposed at once 52 in the vicinity of 300 nm to expose the far ultraviolet ray resist 44 (C).

Then the far ultraviolet resist 44 is developed, and a resist pattern 44a is formed. At this time, the ultraviolet ray resist 46a patterned by the developing solution may be either left over or elimnated (D). According to this method, owing to the flatness of the far ultraviolet ray resist 44, reduction of film thickness of ultraviolet ray resist 46, and CEL effect of pattern forming organic film 48, a 0.4 $\mu$m line-and-space pattern could be formed regardless of the step.

(EMBODIMENT 18)

Figure 17A:
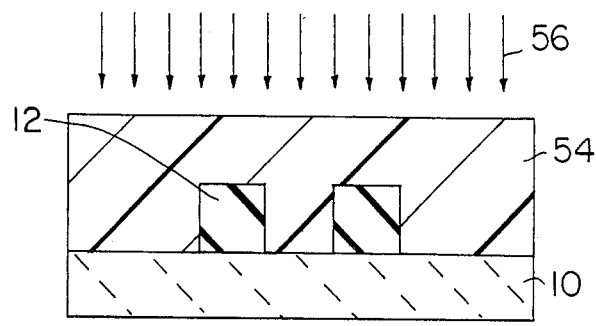
Figure 17B:
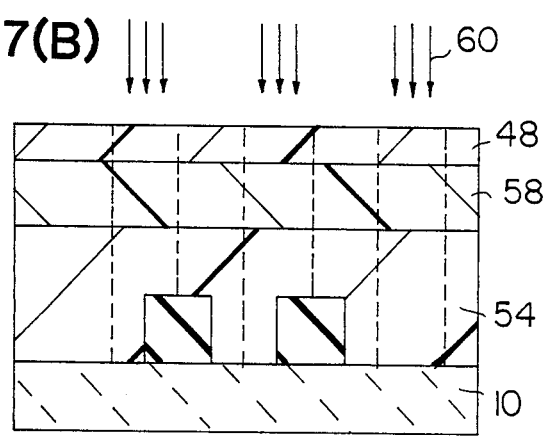
Figure 17C:
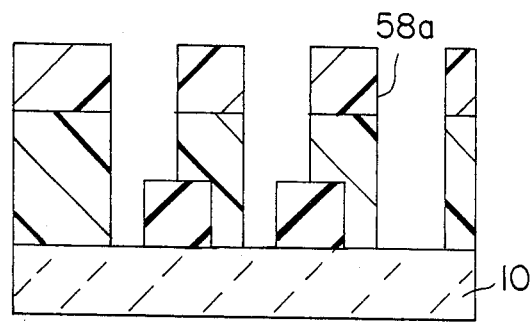

In FIG. 17, an ultraviolet ray resist 54, for example, MP1400-27 (made by Shipley) is applied on a substrate 10 having steps 12 in a thickness of 2 to 3 $\mu$m to flatten the surface, and was edposed at the wavelength 56 of about 436 nm (A). A positive resist 58 similar to said ultraviolet ray resist 54 is laid over, and said pattern forming organic film 48 is further applied in a thickness of about 0.5 $\mu$m. An ultraviolet ray exposure 60 is applied selectively to photosensitize the pattern forming organic film 48, upper and lower layers of positive resists 54, 58 (B). Finally, the entire surface of pattern forming organic film 48, and upper and lower layers of positive resists 54, 58 are developed simultaneously to form a pattern 58a (C).

In this embodiment, as the resist 58, any material that may be developed in developing solution of water or alkaline aqueous solution may be used, and a commonly used diazo type positive resist is a representative one.

While specific embodiments of the invention have been illustrated and described herein, it is realized that modifications and changes will occur to those skilled in the art. It is tnerefore to be understood that the appended claims are intended to cover all modifications and changes as fall within the true spirit and scope of the invention.

What is claimed is:

1. A pattern forming organic film of a multi-layer structure consisting essentially of:
   a radiation sensitive resin layer capable of being developed with a developing agent, and
   a separate water-soluble polymeric layer containing pullulan as the main polymer which is produced and refined by bacterial culture and which is removable by a developing agent used for the development of said radiation-sensitive resin, said water-soluble polymeric layer containing a light absorbing agent capable of absorbing light in the ultraviolet region of 500 nm or less.

2. The pattern forming organic film of claim 1, wherein said radiation sensitive resin is a positive UV resist.

3. The pattern forming organic film of claim 1, wherein said water-soluble organic layer also contains at least one material selected from the group consisting of polysaccharides, gelatin, casein, polyvinyl pyrrolidone, and polyvinyl alcohol.

4. The pattern forming organic film of claim 1, wherein said developing agent is an alkali developing agent for a positive UV resist.

5. The pattern forming organic film of claim 1, wherein multi-layers of said organic film are formed on a substrate having steps.

6. The pattern forming organic film of claim 1, wherein said water-soluble polymeric layer is a contrast enhancement layer having color fading or bleaching action against light for exposure onto said radiation sensitive resin.

7. The pattern forming organic film of claim 1, wherein said light absorbing agent is a compound which contains at least one member selected from the group consisting of a diazo group, an azide group, a cinnamoyl group, an acryloyl group, a cinnamiliden group, a double bond, an epoxy group, a triple bond, a chloromethyl group, an iodomethyl group, a silicon-silicon double bond, a carbon-carbon single bond, and a carbon-sulfur single bond.

8. The pattern forming organic film of claim 5 wherein the substrate is a semiconductor.

9. A pattern forming organic film of a multi-layer structure consisting essentially of:
   a radiation sensitive resin resist layer, and
   a water-soluble polymeric film as a separate layer containing pullulan produced and refined by bacterial culture as the main polymer, said polymeric film formed on said resist, and which polymeric film has color-fading or bleaching action against light for exposure onto said resist and which polymeric film can be removed by a developing agent for use in the development of said radiation sensitive resist.

10. The pattern forming organic film of claim 9 where multi-layers of said organic film are formed on a semiconductor substrate.

11. A pattern forming organic film of a multi-layer structure consisting essentially of:
    a radiation sensitive resin capable of being developed by a developing agent, and
    a separate water-soluble polymeric layer containing pullulan as the main polymer, which pullulan is produced and refined by bacterial culture, and which water-soluble layer can be removed by a developing agent to be used for the development of said radiation sensitive resin, said water-soluble polymeric layer containing a light absorbing agent capable of absorbing light in the ultraviolet region of 500 nm or less, said light absorbing agent being a compound which contains at least one member selected from the group consisting of a diazo group, and azide group, a cinnamoyl group, an acryloyl group, a cinnamiliden group, a double bond, an epoxy group, a triple bond, a chloromethyl group, an iodomethyl group, a silicon-silicon double bond, a carbon-carbon single bond, and a carbon-sulfur single bond.

12. The pattern forming organic film of claim 11 where multi-layers of said organic film are formed on a semiconductor substrate.

* * * * *